United States Patent [19]
Nishitani

[11] Patent Number: 5,293,295
[45] Date of Patent: Mar. 8, 1994

[54] DIGITAL PROTECTIVE RELAY APPARATUS

[75] Inventor: Yasuchika Nishitani, Tokorozawa, Japan

[73] Assignee: Kabushiki Kaisha Toshiba, Kawasaki, Japan

[21] Appl. No.: 907,632

[22] Filed: Jul. 2, 1992

[30] Foreign Application Priority Data

Jul. 5, 1991 [JP] Japan .................. 3-165597

[51] Int. Cl.⁵ .............................. H02H 3/08
[52] U.S. Cl. ............................ 361/63; 361/87; 364/483
[58] Field of Search .............. 361/62, 63, 64, 65, 361/66, 68, 86, 87, 93; 364/483

[56] References Cited

U.S. PATENT DOCUMENTS

| | | |
|---|---|---|
| 4,275,429 | 6/1981 | Church et al. |
| 4,321,681 | 3/1982 | Sackin et al. |
| 4,536,815 | 8/1985 | Li et al. |
| 4,709,295 | 11/1987 | Yamaura et al. |
| 4,825,326 | 4/1989 | Andow et al. ............ 361/63 |
| 4,841,405 | 6/1989 | Udren ....................... 361/80 |

FOREIGN PATENT DOCUMENTS 0488123  6/1992  European Pat. Off.

Primary Examiner—Todd DeBoer
Attorney, Agent, or Firm—Oblon, Spivak, McClelland, Maier & Neustadt

[57] ABSTRACT

A digital protective relay apparatus comprising an analog input section, a correction value-calculating section, a storage section, a correction section, a protective calculation section. A correction value for correcting the error of the analog input section is predetermined and stored in the storage section. Digital data obtained through the analog input circuit is corrected by the correction section using the correction value. The protective calculation section performs predetermined calculation using the corrected digital data, thereby determining whether or not a trip instruction should be supplied to a breaker.

12 Claims, 4 Drawing Sheets

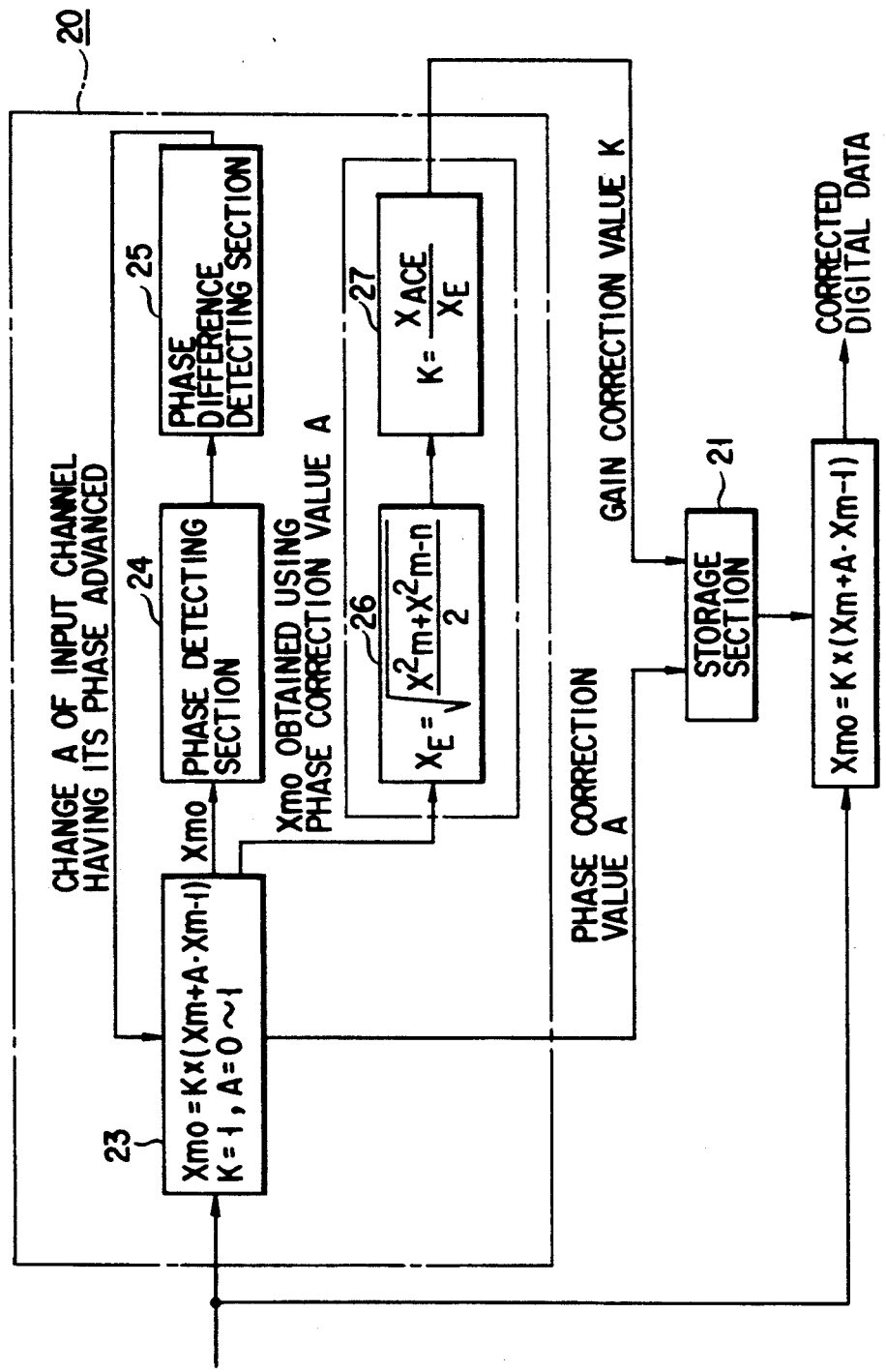
F I G. 2

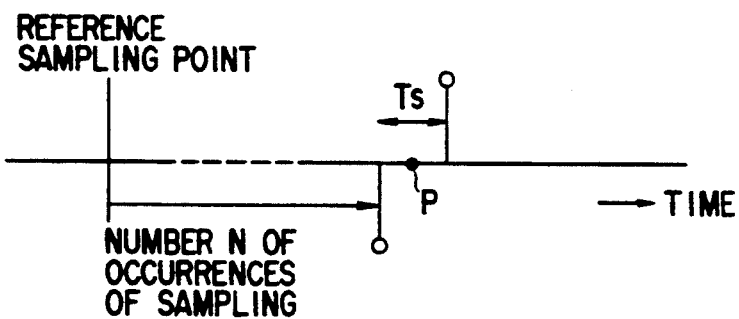
F I G. 3
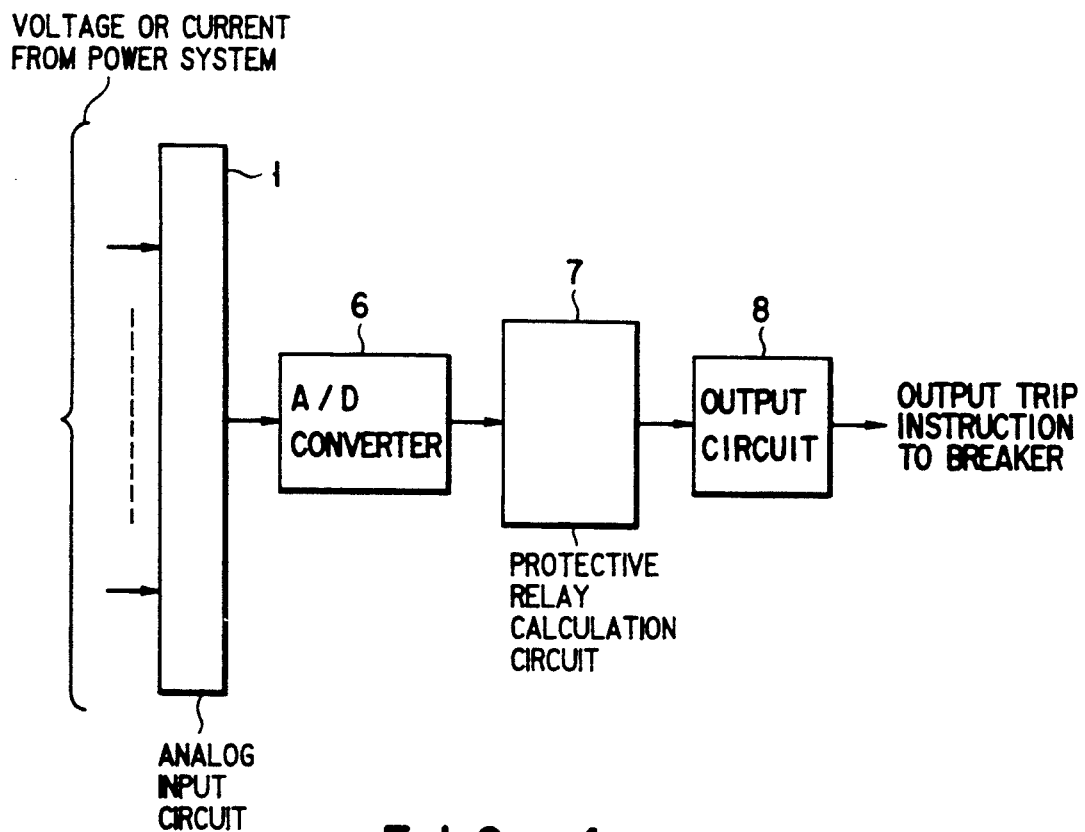
F I G. 4

DIGITAL PROTECTIVE RELAY APPARATUS

BACKGROUND OF THE INVENTION

1. Field of the Invention

This invention relates to a digital protective relay apparatus to be used for protecting a power system, and more particularly to an apparatus of this type equipped with a function of correcting an error caused in an analog input circuit incorporated therein.

2. Description of the Related Art

A conventional digital protective relay apparatus will be described referring to FIG. 4.

In the digital protective relay apparatus, the various analog amounts of a power system employed in the apparatus, such as current flowing through the power supply line and bus line of the power system and voltage applied thereto, are input in parallel into an analog input circuit 1.

The analog input circuit 1 is constructed generally as shown in FIG. 5. Specifically, it has a plurality of input channels each comprising a transformer 2, a filter circuit 3, and a sample/hold circuit 4. The output terminal of each circuit 4 is connected to a multiplexer 5.

The voltage or current input to each input channel of the circuit 1 is supplied to a corresponding transformer 2 where it is subjected to level transform, and is then supplied to the filter circuit 3 where those high frequency components contained in it which are unnecessary for protection calculation are removed. Thereafter, an output signal from the filter circuit 3 is input to the sample/hold circuit 4, where it is sampled at predetermined intervals of time and the resultant sampling value is kept for a predetermined period of time.

The multiplexer 5 changes the outputs of the sample/hold circuits 4 from one to another, thereby selecting the analog values of the input channels.

The analog signal selected by the multiplexer 5 is input to an A/D converter 6, where it is converted to digital data signal. The digital data signal is input to a protective relay calculation circuit 7.

The circuit 7 performs predetermined protective relay calculation using the input digital data signal, and supplies an output circuit 8 with a trip trigger signal when the calculation result indicates occurrence of a fault in the power system. Upon receipt of the trip trigger signal from the calculation circuit 7, the output circuit 8 outputs a trip instruction to a breaker provided in the power system.

In the analog input circuit 1, there exist errors in the characteristics of an output with respect to an input (i.e., in the amplitude gain of the output and/or in the phase of the same) of the output relative to the input due to various constants of the structural elements therein. These errors should be eliminated since they adversely affect the protective function of the circuit.

To this end, in the conventional digital protective relay apparatus, the analog input circuit 1 incorporates a correction circuit 13 comprising an adjustable resistor 11 and an adjustable capacitor 12 and disposed to perform error-correction of digital data, as is shown in FIG. 6.

In this conventional apparatus, a calibration signal having a waveform similar to that of an analog amount of electricity is input to the analog input circuit 1 from the power system, and is detected after having passed the circuit 1. The variable resistor 11 and variable capacitor 12 are adjusted in accordance with a detection result.

Since the constant of each component of the analog input circuit 1 varies with the lapse of time, it is necessary to periodically adjust the correction circuit 13.

As described above, the conventional digital protective relay apparatus is disadvantageous in that its calibration procedure is complicated and hence requires much labor.

SUMMARY OF THE INVENTION

It is the object of the invention to provide a reliable digital protective relay apparatus having an analog input circuit which can be calibrated in a simple manner.

To attain the object, the digital protective relay apparatus of the invention comprises: an analog input section for sampling an analog amount of electricity in a power system to subject the sampled electricity to predetermined processing; A/D converted for receiving the analog amount of electricity output from the analog input section to convert the same to digital data; correction value-calculating section for receiving the digital data from the A/D converter to calculate a correction value for correcting an error containing the digital data; storage section for storing the correction value obtained by the correction value-calculating section; correction section for correcting the digital data output from the A/D converter by the use of the correction value stored in the storage section; and protective calculating section for receiving the corrected digital data to effect predetermined calculation based on the received data, and outputting a trip instruction to a breaker when a calculation result indicates that an abnormality occurs in the power system.

In the digital protective relay apparatus of the invention, the correction value is obtained by predetermined calculation performed using digital data in the correction value-calculating section, and is stored in the storage section. The digital data is corrected by the use of the correction value in the correction section, thereby providing data equivalent to that obtained when there are no errors in the analog input circuit. By using this errorless data, the protective calculation section can perform errorless calculation.

BRIEF DESCRIPTION OF THE DRAWINGS

FIG. 2 is a block diagram, showing in detail a correction value-calculating section depicted in FIG. 1;

FIG. 3 is a graph, useful in explaining a phase calculation by the use of a zero-crossing method;

FIG. 4 is a block diagram, showing a conventional digital protective relay apparatus;

DETAILED DESCRIPTION OF THE PREFERRED EMBODIMENT

The embodiment of the invention will be explained with reference to the accompanying drawings.

Figure 5:
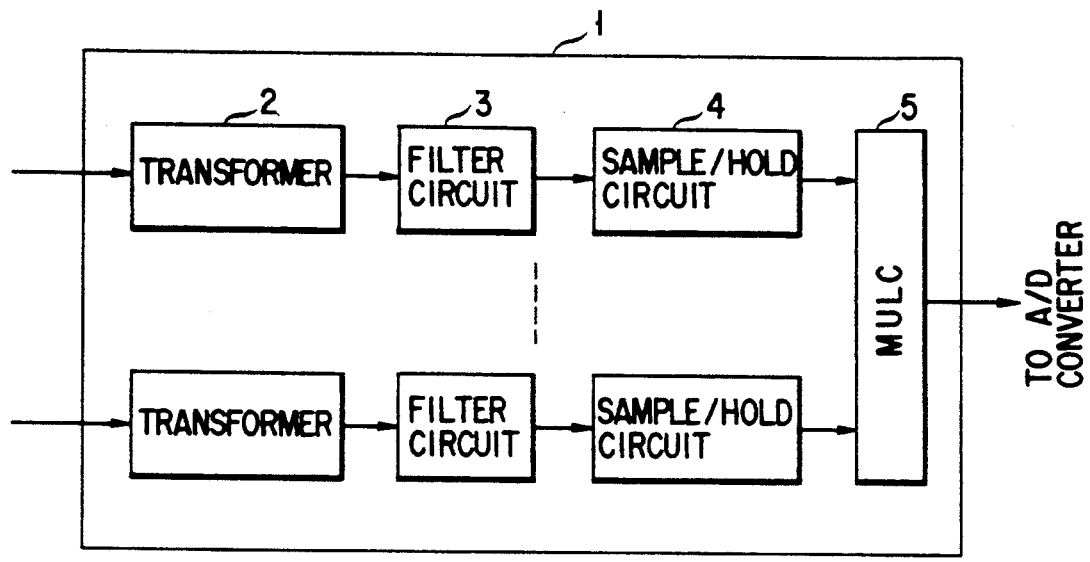
FIG. 5 shows an analog input circuit employed in the apparatus of FIG. 4.

The digital protective relay apparatus of the invention comprises an analog input circuit, an A/D converter, a correction/protection calculating section, and an output circuit. The analog input circuit, A/D converter, and output circuit have structures similar to those of the corresponding elements shown in FIG. 4. That is, the analog input circuit is constructed as shown in FIG. 5, and is supplied with a signal corresponding to the sampled analog electricity amount of the power system. The A/D converter is connected to the output terminal of the analog input circuit, for converting to digital data the analog electricity amount selected by the multiplexer of the analog input circuit. The digital data is input to the correction/protection calculating section. Hereinbelow, the analog input circuit, A/D converter, and output circuit will be explained using reference numerals in FIG. 4.

Figure 1:
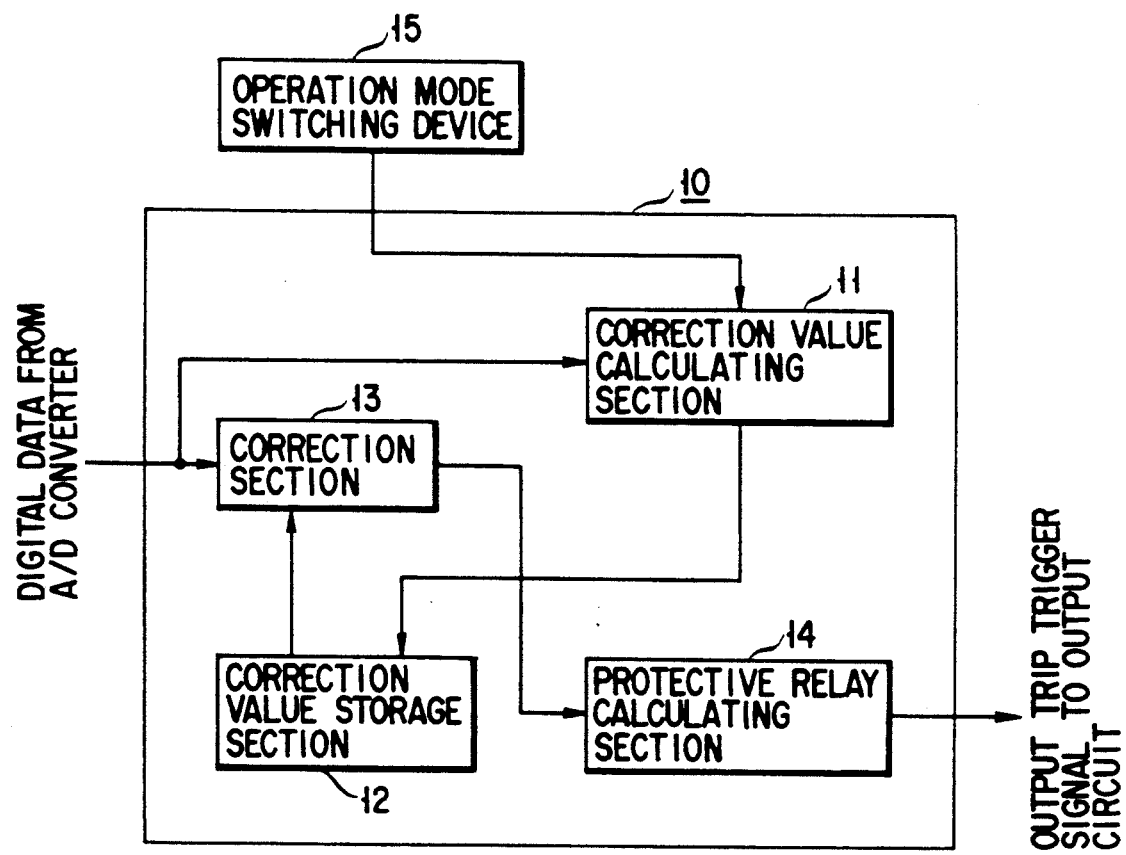
FIG. 1 is a block diagram, showing a calculation circuit employed in a digital protective relay apparatus according to the invention.

FIG. 1 shows the correction/protection calculating section (hereinafter referred to as "calculating section").

The calculating section comprises the following:

a correction value-calculating section 11, supplied with digital data from the A/D converter 6, for operating a calculation to obtain a correction value for removing a gain error caused by the analog input circuit 1 and A/D converter 6, a storage section 12 for storing the correction value obtained by the section 11, a correction section 13 for correcting digital data output from the A/D converter 6, using the correction value stored in the storage section 12, a protective relay calculating section 14 responsive to the corrected digital data for performing predetermined calculation, thereby outputting a trip trigger signal when the calculation result indicates that an abnormality occurs in the power system.

Further, an operation mode switching device 15 is provided for supplying the correction value-calculating section 11 with a signal instructing change of the mode of the apparatus from calibration mode to operation mode or vice versa. In the calibration mode, the correction value-calculating section 11 takes in digital data to obtain a correction value, and stores the correction value in the storage section 12. In the operation mode, the correction section 13 takes in the digital data and correction value, corrects the digital data, and outputs the corrected data to the protective relay calculating section 14.

The correction section 13 corrects the digital data, supplied from the A/D converter 6, in accordance with the following equation (1):

$$Xmo = Xm \times K \qquad \ldots (1)$$

where symbol Xm represents digital data sampled at a certain point of time, and K a correction value stored in the storage section 12.

The correction value-calculating section 11 obtains the correction value K by performing, in the calibration mode, calculation with respect of the digital data from the A/D converter 6, using the following equation (2):

$$K = X_{DC}/Xm \qquad \ldots (2)$$

where $X_{DC}$ represents ideal digital data output from the A/D converter 6 when an analog amount of electricity having a DC waveform is input to the analog input circuit 1, assuming that there are no gain errors in the circuit 1 and converter 6. This ideal digital data is predetermined at the stage of designing.

The protective relay calculating section 14 performs a predetermined protective relay calculation using the digital data Xmo corrected in the correction section 13 with the use of the equation (1).

The operation of the above-described apparatus will now be explained.

Assuming that digital data to be obtained when there are no gain errors in the analog input circuit 1 and A/D converter 6 is Ym, the relationship between this digital data Ym and the digital data Xm output from the A/D converter 6 when gain errors are exist in the analog digital circuit 1 can be expressed by the following equation:

$$Xm \times K = Ym \qquad \ldots (3)$$

The digital data $X_{DC}$, which is to be obtained from the A/D converter 6 assuming that a calibration signal having a DC waveform is input to the analog input circuit 1, and that there are no gain errors in the circuit 1 and converter 6, is predetermined as explained above. On the other hand, the relationship between the digital data $X_{DC}$ and the digital data Xm obtained when a signal having the same predetermined DC waveform is input to the input circuit 1 in a case where gain errors are actually exist therein will be given by the following equation in view of the above equation (3):

$$Xmo \times K = X_{DC} \qquad \ldots (4)$$

Thus, the correction value calculating section 11 calculates $X_{DC}/Xm$, thereby obtaining the correction value K. The value K is stored in the storage section 12.

In the operation mode, the correction section 13 calculates Xmo by filling the correction value K in the equation (1). Xmo obtained using the correction value K is equal to Ym.

The correction value K obtained from the equation (2) and stored in the correction value storage section 12 is renewed only when the operation mode switching device 15 sets calibration mode, and is kept as it is during normal operation.

The input channels of the analog input circuit 1 have respective correction values K, and these values K are stored in the storage section 12. The correction section 13 reads from the storage section 12 a correction value K corresponding to the input channel of the digital data, thereby performing correction expressed by the equation (1).

Figure 6:
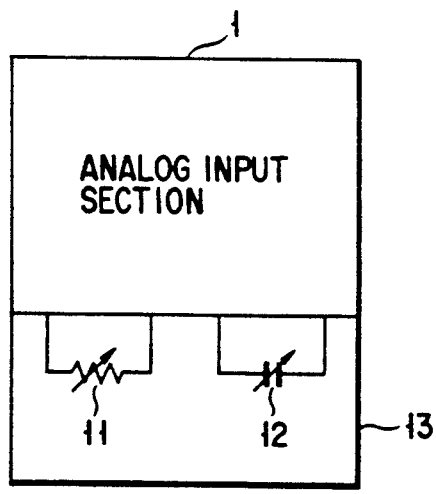
FIG. 6 shows a correction circuit employed in the apparatus of FIG. 4.

In the first embodiment, adjustment performed by the correction circuit 13 shown in FIG. 6 is unnecessary, and further gain errors can be removed from the analog input circuit 1 and A/D converter 6, thereby enabling protective relay calculation using digital data equivalent to gain-errorless digital data. As a result, processing required for correcting gain errors in the analog input circuit 1 and A/D converter 6 is omitted, thus enhancing the reliability of the apparatus.

In the first embodiment, an analog amount of electricity having a DC waveform is subjected to the correction. Then, a digital protective relay apparatus equipped with a calculating section for correcting an analog amount of electricity having an AC waveform will be hereinafter explained as a second embodiment.

The second embodiment is similar to the first embodiment except the correction section. Therefore, only the correction value calculating section will be described in detail.

A correction value calculating section 15' employed in the second embodiment performs calculation based on the following equations (5) and (6) or (7) so as to obtain a correction value K:

$$K = X_{ACE}/X_E \quad \ldots (5)$$

where symbol $X_{ACE}$ represents the root means square value of desired digital data output from the A/D converter 6, assuming that a calibration signal having an AC waveform is input to the analog input circuit 1, and that there are no gain errors in the circuit 1 and converter 6. Since the ideal digital data is predetermined, the root means square value $X_{ACE}$ is accordingly predetermined. Further, symbol $X_E$ represents the root means square value of the digital data output from the A/D converter 6 when a signal having the same AC waveform is input to the input circuit 1 in a case where gain errors are actually found therein.

The value $X_E$ is given by the following equations (6) and (7):

$$X_E = \{(Xm^2 + X(m-n)^2)/2\}^{\frac{1}{2}} \quad \ldots (6)$$

where symbols Xm and X(m−n) represent digital data items sampled at a time interval corresponding to 90 degrees of the AC waveform.

$$X_E = \{(Xm^2 + X(m-1)^2 + \ldots + X(m-k)/(k-1)\}^{\frac{1}{2}} \quad \ldots (7)$$

where symbols Xm−X(m-k) represent digital data items sampled each time a period corresponding to one cycle of the AC waveform elapses.

According to the second embodiment, also in the analog input circuit 1 supplied with the AC waveform, gain errors contained in the digital data output from the circuit 1 can be removed, thereby providing an advantage similar to that of the first embodiment.

The first and second embodiments are directed to the correction of gain errors caused in the analog input circuit. Apart from such gain errors, where the apparatus has a plurality of input channels, it is possible that phase errors are caused between the input channels. Such phase errors may adversely affect the calculation performed in the protective relay calculating section 14, thereby reducing the reliability of the apparatus.

A third embodiment will be explained, which is directed to a digital protective relay apparatus capable of correcting such phase errors caused between input channels, as well as the gain errors caused in the analog input circuit 1 and A/D converter 6.

This embodiment is similar to the second embodiment except the structures of the correction value calculating section 11, storage section 12, and correction section 13. Thus, only the correction value calculating section, storage section, and correction section will be explained in detail.

As is shown in FIG. 2, the digital protective relay apparatus according to the third embodiment is provided with a correction value calculating section 20, a storage section 21, and a correction section 22.

The correction value calculating section 20 has a phase-variable block 23, a phase-detecting section 24, a phase-error detecting section 25, an effective value-calculating section 26, and a gain correction value-calculating section 27.

The phase-variable block 23 is supplied from the A/D converter 6 with the digital data Xm, which is provided for each input channel of the input circuit 1.

Upon receipt of the digital data Xm, the block 23 performs calculation based on the received data, using the following equation:

$$Xmo = K \times (Xm + A \times X(m-1)) \quad \ldots (8)$$

where Xm represents digital data sampled at a point of time, X(m−1) digital data sampled previous to Xm, K a gain correction value peculiar to each input channel, and A a phase correction value peculiar to the input channel.

The phase-variable block 23 fixes, at the time of performing calculation using the equation (8), the gain correction value K at 1 (i.e., assumes that there are no gain errors) and varies the phase correction value A within a range of 0–1 in accordance with a signal from the phase-error detecting section 25, thereby determining such phase correction values A for the respective input channels as make the phases of the channels identical to one another.

The phase-detecting section 24 is responsive to digital data supplied from the phase-variable block 23 for detecting the phase $\theta$ of the digital data Xmo of each input channel, using the zero-cross method expressed by the following equation (9):

$$\theta = \{N + X(n-1)/(X(n-1) - X)\} \times 2\pi \times Ts/T \quad \ldots (9)$$

where, as is shown in FIG. 3, X(n−1) represents a value sampled immediately before the digital data crosses zero, Xn a value sampled immediately after it crosses zero, N the number of occasions of sampling from a reference sampling point to a sampling point n−1, Ts a sampling cycle, and T the cycle of the input AC waveform.

The phase-error detecting section 25 compares the phases of the input channels with one another, sets as a reference phase the phase of an input channel which is most retarded in phase in all the input channels, and causes the phase-variable block 23 to vary the phase correction values A of the input channels whose phases are advanced relative to the reference phase. Thus, the phase correction values A, which can cause the phases of all the input channels to be identical to one another, are determined for the input channels, respectively.

The phase-variable block 23 stores the determined phase correction values A in the storage section 21, and outputs digital data Xmo calculated using the determined correction values A, to the effective value-calculating part 26.

The effective value-calculating section 26 calculates the root means square values $X_E$ of the digital data Xmo thus calculated, using the equation (6).

The gain correction value-calculating section 27 reads the effective values $X_E$ from the calculating section 26, thereby calculating the gain correction values K of the input channels using the equation (5), and storing the values K in the storage section 21.

Thus, the storage section 21 stores the phase correction values A supplied from the phase-variable block 23, and the gain correction values K supplied from the gain correction value-calculating section 27.

The correction section 22 reads the phase correction values A and gain correction values K from the storage section 21, and performs calculation using the equation (8).

Then, the operation of the apparatus of the invention will be explained more specifically.

Assume that the analog input circuit 1 has first and second input channels, and that these input channels ideally generate outputs with a gain of 1/10 and without phase errors, with respect to inputs having a reference waveform (50 Hz). In reality, however, in the circuit 1, the first input channel has a gain error of +5% and a phase error of +0.5°, while the second input channel has a gain error of −7% and a phase error of +1.0°.

An analog amount Vi of electricity input to the analog input circuit 1 is:

$$Vi = 100 \sin(100\pi t)$$

An ideal output Vo for each of the first and second channels is:

$$Vo = 10 \sin(100\pi t)$$

Actually, however, each channel has the above-described errors, so that the outputs Vo1 and Vo2 of the first and second channels are:

$$Vo1 = 10.5 \sin(100\pi t + 0.5\pi/180)$$

$$Vo2 = 9.3 \sin(100\pi t + \pi/180)$$

Here, assume that the analog amount of electricity is sampled with a frequency of 4800 Hz. At this time, the sampling time series t0, t1, t2, ..., tK are:

$$t0 = 0 \times Ts, \ t1 = 1 \times Ts, \ t2 = 2 \times Ts, \ldots, \ tK = K \times Ts$$

Ts = 1/4800.

Assume that the sampling data series of the first and second channels with respect to the sampling time series are:

Vo10, Vo11, Vo12, ..., Vo1K

Vo20, Vo21, Vo22, ..., Vo2K

At this time, the following are satisfied:

Vo195 < 0, Vo196 > 0

Vo295 < 0, Vo296 > 0

This means that the data value of each of the first and second channels crosses zero between the 95th sampling point from the reference sampling point and the 96th sampling point from the same. Accordingly, the phases $\theta_1$ and $\theta_2$ of the data of the first and second channels are:

$$\begin{aligned}\theta_1 &= \{95 + Vo195/(Vo195 - Vo196)\} \times 2\pi \times Ts/T \\ &= 6.2744547\end{aligned}$$

$$\begin{aligned}\theta_2 &= \{95 + Vo295/(Vo295 - Vo296)\} \times 2\pi \times Ts/T \\ &= 6.2657277\end{aligned}$$

where T = 1/50.

Since the phase $\theta_1$ of the first channel is larger than the phase $\theta_2$ of the second channel, the phase-error detecting section 25 supplies the phase-variable block 23 with an instruction for changing the phase correction value A of the second channel so as to cause the phases $\theta_1$ and $\theta_2$ to coincide with each other, thereby obtaining a phase correction value A2 which enables the both phases to coincide with each other.

Specifically, the phase correction value A2 is obtained as follows, assuming that the phase correction value A1 of the first channel is zero:

Since Vo2K* = Vo2K + A2 × Vo2 (K−1), the following equation is satisfied by substituting 0.1539267 for A2:

$$\begin{aligned}\theta_2^* &= \{95 + Vo295^*/(Vo295^* - Vo296^*)\} \times 2\pi \times Ts/T \\ &= 6.2744547 = \theta_1 \ (= \theta^*_1)\end{aligned}$$

Accordingly, the phase correction value A2 is determined to be 0.1539267.

Further, the amplitude values (i.e., root means square values) V1* and V2* are:

$$V1^* = \{(Vo1(K-24)^{*2} + Vo1K^{*2})/2\}^{\frac{1}{2}} = 7.4246212$$

$$V2^* = \{(Vo2(K-24)^{*2} + Vo2lK^{*2})/2\}^{\frac{1}{2}} = 7.5864511$$

Since the true value $V_T$ of V is $10/2^{\frac{1}{2}}$, the following are satisfied:

$$K1 = V_T/V1^* = 0.9523809$$

$$K2 = V_T/V2^* = 0.9320652$$

Vo1K* and Vo2K* are calculated using the obtained K1, K2, A1, and A2.

$$Vo1K^* = K1 \times (Vo1K + A1 \times Vo1(K-1))$$

$$Vo2K^* = K2 \times (Vo2K + A2 \times Vo2(K-1))$$

Thus, Vo1K* and Vo2K* coincide with each other, and the phase error between the first and second channels is corrected. Further, the effective value obtained using Vo1K* or Vo2K* is $10/(\frac{1}{2})^{\frac{1}{2}}$, which means that the gain error is corrected.

In the embodiment, the timing error of sampling between the channels is also corrected, in addition to the gain error of each channel and the phase error between the channels.

As is described above, the third embodiment can provide the gain correction value K of each input channel and the phase correction value A between the input channels, thereby simultaneously correcting the gain errors and phase error. As a result, the protective relay calculating section can perform reliable calculation.

Moreover, in the third embodiment, the correction section 22 can perform correction processing using the following equation (10) in place of the equation (8):

$$Xmo = \sum_{n=0}^{N} (Kn \times X(m-n)) \tag{10}$$

where Xm, Xm−1, ..., and X(m−N) represent digital data sampled at different sampling time points, K0, K1, ..., and $K_N$ correction values peculiar to each input channel.

That is, the degree of phase correction is determined from the relative rate of each of the correction values K0, K1, ..., and $K_N$, while the degree of gain correction is determined from the absolute value of each of the correction values K0, K1, ..., and $K_N$.

In all the embodiments, the correction section and correction value-calculating section can be realized by hardware or software.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A digital protective relay apparatus for outputting a trip instruction to a breaker provided in a power system for protecting the same when a fault occurs therein, comprising:
    an analog input section for sampling an analog amount of electricity in the power system to subject the sampled electricity to predetermined processing;
    A/D converter means for receiving the analog amount of electricity output from the analog input section to convert the same to digital data;
    correction value-calculating means for receiving the digital data from the A/D converter means to calculate a correction value for correcting an error contained in the digital data when the digital data passes through the analog input section and the A/D converter means;
    storage means for storing the correction value obtained by the correction value-calculating means;
    correction means for correcting the digital data output from the A/D converter means by the use of the correction value stored in the storage means; and
    protective calculating means for receiving the corrected digital data, and operating predetermined calculation using the received data, and outputting the trip instruction to the breaker when a calculation result indicates that the fault occurs in the power system.

2. The digital protective relay apparatus according to claim 1, wherein the correction value calculating-means obtains the correction value for correcting a gain error of the analog input section and A/D converter means with respect to the analog amount of electricity having a DC waveform, using the following equation:

$$K = X_{DC}/Xm$$

where K represents the correction value for correcting the gain error, $X_{DC}$ ideal digital data output from the A/D converter means in accordance with the analog amount of electricity having the DC waveform input to the analog input section, assuming that there are no gain errors in the analog input section and converter means, and Xm the actual digital data output from the A/D converter means in accordance with the analog amount of electricity input to the analog input section.

3. The digital protective relay apparatus according to claim 2, wherein the correction means corrects the digital data output from the A/D converter means, using the following equation:

$$Xmo = Xm \times K$$

where Xmo is digital data obtained after correction.

4. The digital protective relay apparatus according to claim 1, wherein the correction value calculating-means obtains the correction value for correcting the gain errors of the analog input section and A/D converter means with respect to the analog amount of electricity having an AC waveform, using the following equation:

$$K = X_{ACE}/X_E$$

where K represents the correction value for correcting the gain errors, $X_{ACE}$ root means square value of digital data output from the A/D converter means in accordance with the analog amount of electricity having the AC waveform input to the analog input section, assuming that there are no gain errors in the analog input section and converter means, and $X_E$ root means square value of the actual digital data output from the A/D converter means in accordance with the analog amount of electricity having the AC waveform input to the analog input section.

5. The digital protective relay apparatus according to claim 4, wherein the correction means corrects the digital data output from the A/D converter means in accordance with the analog amount of electricity from the power system, using the following equation:

$$Xmo = Xm \times K$$

where Xmo represents digital data obtained after correction.

6. The digital protective relay apparatus according to claim 1, wherein the analog input section has a plurality of input channels for respectively processing a plurality of an analog amount of electricity simultaneously supplied from the power system; the correction value-calculating means includes phase-correcting value detection means for detecting a phase-correcting value for correcting a phase error caused between the input channels with respect to the analog amount of electricity having an AC waveform, and gain correction value-detecting means for obtaining a gain correction value for correcting the gain errors of the analog input section and A/D converter means with respect to the analog amount of electricity of the AC waveform.

7. The digital protective relay apparatus according to claim 6, wherein the phase correction value-detecting means has phase detection means for detecting the phase each of an analog amount of electricity passing each of the input channels, and phase correction value-determining means for detecting such phase correction values of the input channels as enable those phases of the input channels which are detected by the phase detection means, to coincide with one another.

8. The digital protective relay apparatus according to claim 7, wherein the phase detection means detects the phase value of each of the input channels by using a zero-cross method.

9. The digital protective relay apparatus according to claim 6, wherein the gain correction value detecting-means obtains the gain correction value of each of the input channels for correcting the gain errors using the following equation:

$$K = X_{ACE}/X_E$$

where K represents the gain correction value for correcting the gain errors, $X_{ACE}$ root means square value of ideal digital data output from the A/D converter means in accordance with the analog amount of electricity having an AC waveform and input to the analog input section, assuming that there are no gain errors in the analog input section and converter means, and $X_E$ root means square value of an actual digital data Xm obtained by correcting, using each phase correction value, the actual digital data Xm output from the A/D converter means in accordance with the analog amount of electricity of the AC waveform input to the analog input section.

10. The digital protective relay apparatus according to claim 6, wherein the correction means corrects the digital data output from the A/D converter means in accordance with the analog amount of electricity from the power system, using the following equation:

$$Xmo = K \times (Xm + A \times X(m-1))$$

where Xmo represents digital data obtained after correction, K the gain correction value, Xm digital data sampled at a certain time point, A the phase correction value, and $X(m-1)$ digital data sampled previous to Xm by one sampling cycle.

11. The digital protective relay apparatus according to claim 6, wherein the correction means corrects the digital data output from the A/D converter means in accordance with the analog amount of electricity from the power system, using the following equation:

$$Xmo = \sum_{n=0}^{N} (Kn \times X(m-n))$$

where Xmo represents digital data obtained after correction, Xm, Xm−1, ..., and X(m−N) digital data sampled at different sampling time points, K0, K1, ..., and $K_N$ correction values peculiar to each input channel.

12. The digital protective relay apparatus according to claim 1, further comprising operation modechanging means for controlling the operation period of the correction value calculating-means, thereby changing the mode of the apparatus from calibration mode to operation mode or vice versa.

* * * * *